United States Patent [19]

Nakagawa

[11] Patent Number: 4,881,257

[45] Date of Patent: Nov. 14, 1989

[54] DEFORMATION FREE X-RAY EXPOSURE MASK FOR X-RAY LITHOGRAPHY

[75] Inventor: Kenji Nakagawa, Isehara, Japan

[73] Assignee: Fujitsu Limited, Kawasaki, Japan

[21] Appl. No.: 111,679

[22] Filed: Oct. 23, 1987

[30] Foreign Application Priority Data

Oct. 28, 1986 [JP] Japan .................. 61-254790

[51] Int. Cl.$^4$ ............................................. G21K 5/00
[52] U.S. Cl. .......................................... 378/35; 378/34; 430/5
[58] Field of Search ............... 378/34, 35; 250/492.24, 250/505.1; 430/5

[56] References Cited

U.S. PATENT DOCUMENTS

| 3,742,229 | 6/1973 | Smith et al. | 378/34 |
| 3,873,824 | 3/1975 | Bean et al. | 378/34 |
| 4,152,601 | 5/1979 | Kadota et al. | 378/34 |
| 4,260,670 | 4/1981 | Burns | 378/35 |
| 4,454,209 | 6/1984 | Blais | 378/35 |
| 4,515,876 | 5/1985 | Yoshihara et al. | 378/35 |
| 4,522,842 | 6/1985 | Levinstein et al. | 378/35 |

FOREIGN PATENT DOCUMENTS

| 0222739 | 5/1987 | European Pat. Off. | 430/5 |
| 0068748 | 4/1983 | Japan | 430/5 |

OTHER PUBLICATIONS

"Use of Random Patterns and Grilles for Mask Alignment in X-Ray Lithography", by Hunziker, IBM Technical Disclosure Bulletin, vol. 20, No. 3, Aug. 1977.

Primary Examiner—Craig E. Church
Assistant Examiner—John C. Freeman
Attorney, Agent, or Firm—Staas & Halsey

[57] ABSTRACT

An X-ray exposure mask for use in a stepper in X-ray lithography is formed so that deformation of mask patterns on a surface of the X-ray mask is prevented, so that when these patterns are transferred to a semiconductor wafer substantially no deformation of the patterns will occur, allowing higher integration of patterns. The surface of the X-ray mask is divided into a centrally located first region and a surrounding second region. A layer of X-ray absorbing material is superposed on the surface of the X-ray mask and includes a first layer portion coextensive with the first central region and patterned for selectively exposing the first central region of the membrane surface in a corresponding pattern for selected transmission of an X-ray beam therethrough. A second layer portion of the layer of X-ray absorbing material, coextensive with the second, surrounding region of the membrane, is patterned for selectively exposing the second, surrounding region to reduce the density of the X-ray absorbing material on that second, surrounding region. Preferably, the respective densities of the first and second layer portions of the X-ray absorbing material are substantially the same, although a difference of up to 30% therebetween will yield satisfactory results.

10 Claims, 4 Drawing Sheets

DEFORMATION FREE X-RAY EXPOSURE MASK FOR X-RAY LITHOGRAPHY

BACKGROUND OF THE INVENTION

1. Field of the Invention

The present invention relates to an X-ray mask used in a stepper for transferring microscopic patterns onto a semiconductor substrate. More particularly, this invention relates to an X-ray mask, wherein deformation of mask patterns due to stresses in the X-ray absorbing material is effectively suppressed.

2. Description of the Related Art

Photo-lithography technology is widely used for forming patterns on semiconductor wafers. Using a stepper, the patterns formed on a mask are transferred optically onto a resist layer of a wafer by a step-and-repeat method, in which the semiconductor wafer is moved in X and Y directions and is exposed at specified positions on the wafer.

The most common prior art approach in photo-lithography has used ultra-violet light to expose the patterns on the wafer. However the ultra-violet light technique has resolution limitations. Diffraction, interference, or light scattering is common, causing reduction of resolution. With the trend toward a higher integration of semiconductor devices, the need to form patterns having up to submicron geometries has developed. This need has been filled in part by X-ray lithography.

In the X-ray lithography, an X-ray source is used to direct X-rays through a mask and onto a resist layer of a semiconductor wafer. The wavelength of X-rays is very short and ranges generally from a few Angstroms to 20 Angstroms. Therefore, conventional mask structures as used with photo-lithography cannot be used. Instead, X-ray masks having a special structure are necessary. Generally, the processes used in X-ray lithography are very similar to those used in photo-lithography. However, X-ray lithography and mask technology have their own problems, which are outlined in "X-ray Lithography and Mask Technology" by Pieter Burggraaf, Semiconductor International, April, 1985, pp. 92–99.

A semiconductor wafer to be processed is mounted on a stage. The X-ray source irradiates an X-ray resist layer on the semiconductor wafer surface through the X-ray mask, thereby transferring the patterns on the X-ray mask to the X-ray resist layer of the wafer. The stage is then moved in X and Y directions to a new predetermined position, and a new location on the wafer is then exposed. This process, conventionally called the "step-and-repeat" method, is repeated a plurality of times. The apparatus used in the step-and-repeat method is called a stepper.

Figures 1, 2, 3:
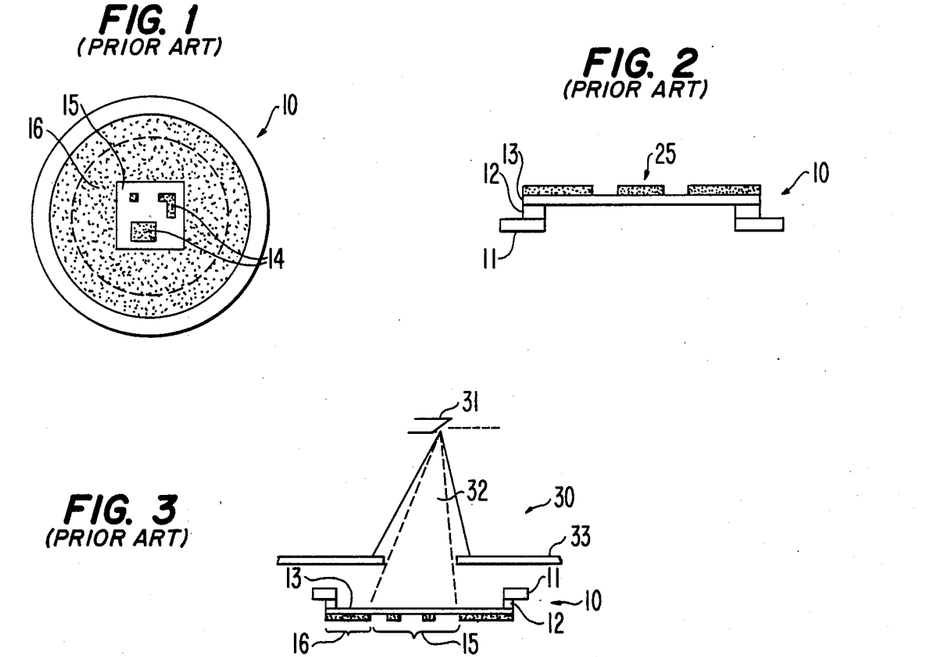
FIG. 1 shows a plan view of an X-ray mask of the prior art.
FIG. 2 is a cross-sectional, elevational view of the X-ray mask of the prior art.
FIG. 3 is a schematic and cross-sectional, elevational view of a stepper utilizing the X-ray mask.

FIG. 1 shows a plan view of a typical X-ray mask 10, and FIG. 2 shows a schematic cross sectional view thereof. A ring 11 of pyrex glass or ceramic material supports a silicon ring 12, which supports a membrane 13. In the X-ray mask making process, originally the silicon ring 12 is a silicon wafer, on which the membrane 13 is formed by growing a layer of inorganic material such as boron nitride (BN), silicon carbide (SiC), or silicon nitride (SiN). This is performed using a Chemical Vapor Deposition (CVD) method, with a resulting thickness of membrane 13 being about 1 to 5 microns. Properties required of the membrane 13 are that it not incur deterioration of mechanical strength due to X-ray irradiation and that it remains flat after the formation of mask patterns thereon.

After formation of the membrane 13 on the silicon wafer, most of the silicon wafer is etched away, leaving the silicon ring 12. The periphery of the membrane 13 is fixed by the silicon ring 12, imparting a controlled tension in the membrane 13 to maintain its flatness.

A layer 25 of X-ray absorbing material, such as gold, is deposited on the membrane 13. The process for depositing the layer 25 is described later. In FIG. 1, a single chip pattern comprising mask patterns 14 comprised of the X-ray absorbing material is illustrated in an effective pattern region 15. The effective region 15 is surrounded by a covered region 16 of the layer 25. In FIG. 1, the areas of the layer 25 on the element 13 which remain after the formation of mask patterns 14 are represented by the dotted areas.

FIG. 3 schematically illustrates the X-ray mask 10 installed in a stepper 30. In exposing a portion of a silicon wafer, an X-ray source 31 generates an X-ray beam 32 which passes through an aperture 33. The X-ray beam 32 then passes through the mask 10 and onto a silicon wafer (not shown) having an X-ray resist layer. The mask patterns 14 of the effective pattern region 15 of the X-ray mask 10 is thereby transferred to the X-ray resist layer on the silicon wafer. The stage on which this silicon wafer is mounted is then moved, and the exposure step is then repeated for another portion of the wafer. This process is repeated a predetermined number of times.

FIGS. 4(a) to 4(e) are schematic cross sectional views of the effective pattern region 15 illustrating the formation of mask patterns on the X-ray mask.

Figure 4A:
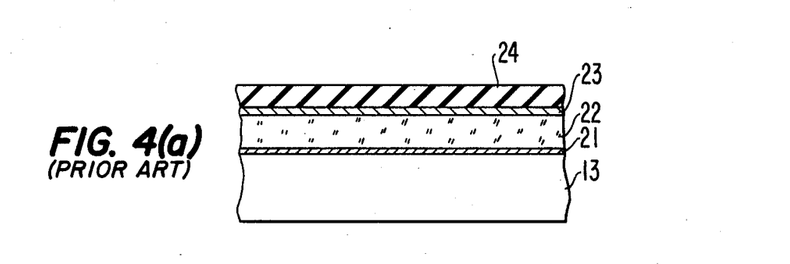
FIGS. 4(a)–4(e) show a series of conventional sequential steps for fabricating mask patterns on the X-ray mask.

In FIG. 4(a), a layer 21 of electrically conductive material composed of, e.g., tantalum/gold/tantalum (Ta/Au/Ta), or gold/titanium (Au/Ti), is formed on the membrane 13. The conductive layer 21 has a thickness of 300 to 500 Angstroms, and functions as a plating base for the subsequent step. A polyimide layer 22 having a thickness of 0.5 to 2 microns is formed on the conductive layer 21, and a second inorganic material layer 23, composed of, e.g., silicon dioxide ($SiO_2$), having a thickness of 500 to 2000 Angstroms is formed on the polyimide layer 22. Finally, an electron beam (EB) resist layer 24 of 1000 to 5000 Angstroms thickness is coated on the second inorganic material layer 23.

Figure 4B:
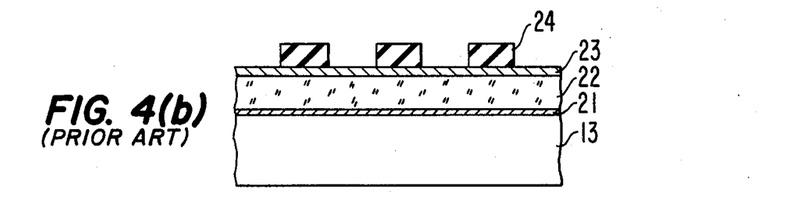
Figure 4C:
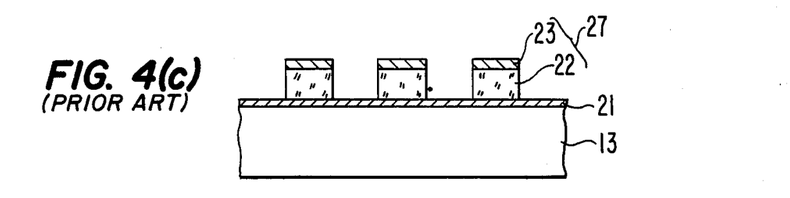

The EB resist layer 24 is exposed to an electron beam and is patterned as shown in FIG. 4(b). The exposed inorganic layer 23 is then etched away by a Reactive Ion Etching (RIE) method using a mixed gas of trifluoromethane ($CHF_3$) and terafluoride ($CF_4$). The exposed polyimide layer 22 and remaining EB resist layer 24 are etched away by an RIE method using oxygen ($O_2$) gas, leaving a so-called stencil structure 27 which forms the pattern, as shown in FIG. 4(c).

Figure 4D:
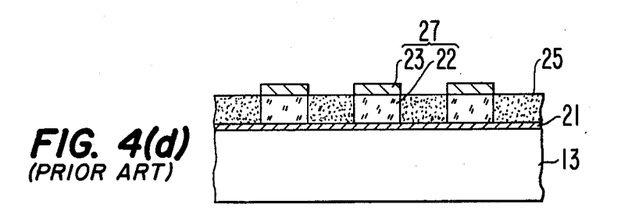
Figure 4E:
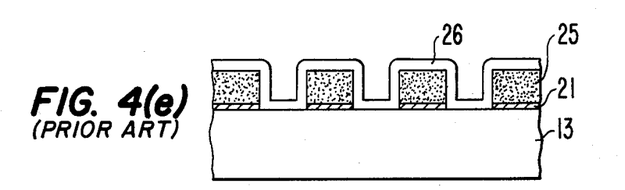

As illustrated in FIG. 4(d), the conductive layer 21 is electrically gold plated, filling the apertures of the stencil structure 27 with gold. The gold functions as the X-ray absorbing layer 25. The remaining inorganic layer 23 and polyimide layer 22 of the stencil structure 27 are then removed by an RIE method using the same gases as those mentioned previously, and the exposed electrically conductive layer 21 is etched away. The removal of electrically conductive layer 21 is necessary for making portions of the X-ray mask translucent to light beams during an alignment procedure for the X-ray mask, which uses alignment marks on the silicon wafer. Finally, as shown in FIG. 4(e), a protection layer 26 is coated over the entire mask. This completes the process of forming patterns on the X-ray mask 10, and FIG. 4(e) shows the finished surface of the X-ray mask 10.

The above method of forming patterns on the X-ray mask is one of several methods that can be utilized. For example, other X-ray absorbing materials, such as tungsten (W) or tantalum (Ta), can be sputtered or coated in other ways on the membrane without using an electrically conductive layer. These materials are subsequently etched to form the patterns.

The X-ray mask must have precise patterns situated on a flat surface of the membrane. Deformations or deviations from the designed dimensions of the patterns must be avoided as much as possible. In order to have the strict properties of flatness and stability required during the pattern forming processes and use in the stepper, the membrane has a thickness of 1 to 5 microns. The exact membrane thickness is determined by the material used for the membrane; for example, when boron nitride is used the preferred membrane thickness is 4 to 5 microns; and when silicon carbide or silicon nitride is the material used the preferred thickness is 2 microns. The thickness depends on a transmission factor for X-ray beams through the membrane material and the material properties for providing tension adequate to maintain the required flatness; therefore, the exact membrane thickness is determined experimentally for the specific material to be used.

Furthermore, the stress generated within the patterned absorbing material becomes an important factor in the design and manufacture of X-ray masks. The tensile or compressive stress in the absorbing material causes displacements of the fringe portions of the formed patterns.

Figure 5A:
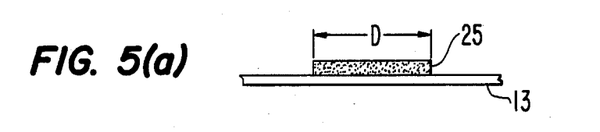
FIG. 5(a) is a cross-sectional view of a membrane and absorbing layer showing an ideal fabricated X-ray mask having no stress generated therein.
Figure 5B:
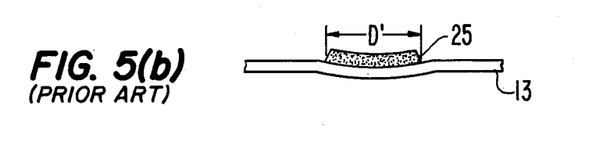
FIG. 5(b) is a schematic cross-sectional view of an X-ray mask deformed by stress generated within the X-ray absorbing material.

FIGS. 5(a) and 5(b) illustrate a simple example of the stress problem. The absorbing material layer 25 having a simple band-shaped pattern is formed on the membrane 13. FIG. 5(a) shows the ideal situation, in which the absorbing material layer 25 has zero stress. The band of absorbing material 25 has a length of D and maintains a flat surface. However, in practice, the absorbing material 25 will be subject to tensile or compressive stress. In the case when tensile stress exists, the band of absorbing material 25 shrinks to a length of D', and the membrane 13 and the absorbing material layer 25 are slightly deformed to an upwardly concave configuration, such as is shown in FIG. 5(b). Conversely, if compressive stress exists, the absorbing material 25 would elongate somewhat.

Figure 6A:
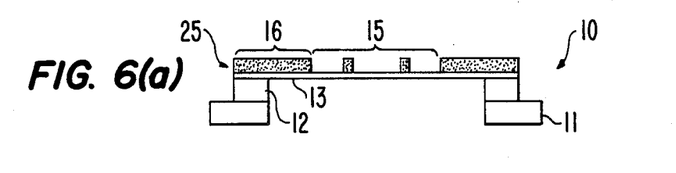
FIGS. 6(a) and 6(b) are cross-sectional schematic views of the typical shape of X-ray masks in the prior art, where 6(a) shows the ideal for an X-ray mask with no stress and 6(b) shows an X-ray mask with stress.
Figure 6B:
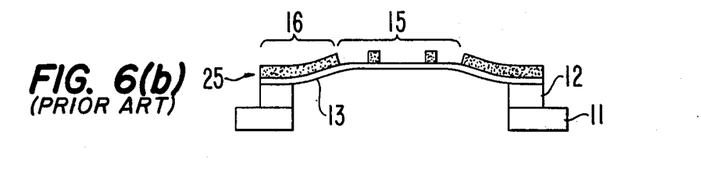

FIG. 6(a) shows the desired situation, where zero stress exists in the absorbing material 25. In the heretofore known practice, however, this result has been difficult to obtain. FIG. 6(b) shows the X-ray mask 10 having the absorbing material layer 25 patterned in the effective pattern region 15 and the non-patterned absorbing material layer 25 in the covered region 16. In FIG. 6(b), the absorbing material layer 25 in both the effective pattern region 15 and the covered region 16 have shrinkage stress, which deforms the surface of the mask 10 to a slightly upwardly convex configuration. The upward deformation in FIG. 6(b) is somewhat exaggerated, however, the displacement of the absorbing material layer 25 and therefore the displacement of the desired pattern along the surface of the mask 10 cannot be ignored. When this X-ray mask 10 is used in the lithography process, the precise pattern will not be reproduced in the resist layer of the silicon wafer.

In the X-ray masks of the prior art, the absorbing material layer 25 is formed without the use of an aperture, and thus the layer 25 forms on the entire surface of the covered region 16, with no consideration given to the absorbing material stress and the resultant displacement of the pattern.

Serious effort has been devoted to minimize the deformation of the mask patterns; however, up to now deformation has remained a difficult problem not yet solved.

SUMMARY OF THE INVENTION

Therefore, it is a general object of the present invention to provide an X-ray mask in which the deformation of mask patterns due to stresses generated in the absorbing material is reduced as much as possible.

It is another object of the invention to provide a non-deformed X-ray mask while using conventional materials and equipment and without special additional processing of the mask.

These objects are accomplished by taking into account the pattern density, which is the amount of surface area in each region covered by the absorbing material layer. As explained above in relation to the related art, a membrane 13 of an X-ray mask 10 supports an absorbing material layer 25 formed on both an effective pattern region 15 and a covered region 16 as shown in FIG. 1. The pattern density A/B is such that A represents the portion of the surface area in a specified area B covered with the absorbing material layer 25. Thus, a pattern density percentage, which represents the percentage surface area of a particular area of element 13 covered with the absorbing material layer 25 is quickly and easily obtainable. Conversely, of course, this definition can be reversed to find the percentage of the surface area of the element 13 not covered by the absorbing material layer 25. As an example, the covered region 16 of FIG. 1 has its entire surface area above the membrane 13 covered with the absorbing material layer 25. Therefore, in the covered region 16 the pattern density percentage is 100%. On the other hand, in the effective pattern region 15, the pattern density percentage is very small (although it can range much higher depending on the particular mask pattern).

After much testing, it has been found that the smaller the difference between the respective pattern densities for the effective pattern region 15 and the covered region 16, the smaller the amount of deformation of the mask patterns.

As explained above in relation to X-ray masks generally, there are two kinds of deformation. The first is the displacement of the absorbing material 25 in the X and Y directions along the surface of the mask, and the second is the warp deformation of the surface of the mask itself. In practice, the first type of deformation is much more important; therefore, the present invention is chiefly concerned with preventing the displacement type deformation.

It has been discovered that the deformation of the X-ray mask can be reduced when the pattern density percentage for the covered region 16 is nearly equal to the pattern density percentage for the effective pattern region 15. This holds true because the stress forces generated in the absorbing material layer 25 in the two regions balance each other, resulting in a very small displacement of the mask patterns.

The equalization of pattern densities can be achieved by forming patterns in the absorbing material layer 25 in the covered region 16. This can be performed at the same time as the formation of the mask patterns in the effective pattern region 15. The variety of patterns that may be formed in the covered region 16 is nearly limitless.

In accordance with the present invention, an X-ray exposure mask is provided to be used for patterning a resist layer of a semiconductor wafer using an X-ray beam, the mask comprising a membrane, translucent to the X-ray beam, having a planar surface including a centrally located X-ray mask region on the surface and a non-mask region surrounding the X-ray mask region, and layer of X-ray absorbing material superposed on the planar surface of the membrane and comprising a first layer portion coextensive with the X-ray mask region and patterned for selectively exposing the X-ray mask region of the membrane surface in a corresponding pattern for selective transmission of an X-ray beam therethrough, and a second layer portion coextensive with the non-mask region and patterned for reducing a pattern density of the X-ray absorbing materials superposed on the non-mask region and balancing stress in the layer of X-ray absorbing material in the first and second layer portions.

Additional objects and advantages of the present invention will be set forth in the following description, reference being had to the accompanying drawings, and, in part, will be obvious, from the description, or may be learned by practice of the invention. The objects and advantages of the invention may be realized and obtained by means of the combinations particularly pointed out in the appended claims.

BRIEF DESCRIPTION OF THE DRAWINGS

FIGS. 12(a) and 12(b) are illustrations of patterns formed in the effective pattern region and the covered region, respectively, of an X-ray mask according to the present invention, wherein pattern densities are substantially similar.

DETAILED DESCRIPTION OF THE PREFERRED EMBODIMENTS

Figure 7A:
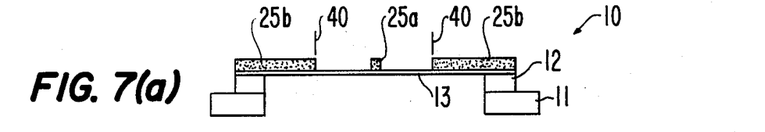
FIG. 7(a) is a cross-sectional, elevational view of a prior art x-ray mask

FIGS. 7(a) shows a schematic cross sectional view of a prior art X-ray mask, in which reference numeral 25a represents the X-ray absorbing material layer in the effective pattern region 15 and reference numeral 25b represents the absorbing material layer in the covered region 16. It is assumed that both of the layers 25a and 25b of absorbing material generate tensile stress after formation, and that the pattern density in the effective pattern region 15 is small and the effect of the absorbing material 25a is negligible. Maximum displacement occurs at the fringe portion 40.

Figure 7B:
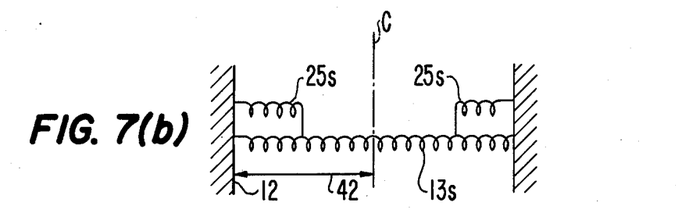
FIGS. 7(b) and 7(c) are analytical diagrams of the displacement caused by the absorbing material in a prior art X-ray mask.

FIG. 7(b) shows an equivalent schematic structure for the surface of this type of mask, were lower springs 13s represent the membrane 13, upper springs 25s represent areas of the absorbing material layer 25b and reference character C represents the center of the surface of the mask. To obtain the displacement, an analysis of one-half of the surface portion of the mask depicted in FIG. 7(b) is sufficient. Therefore, FIG. 7(c), which shows the left half 42 of the mask surface of FIG. 7(b), is used for calculating the deformation. Reference designation L1 corresponds to the portion of the membrane 13 between the fringe 40 and the wafer ring 12 and L1 represents the distance from the fringe 40 to the wafer ring 12. Reference designation L2 corresponds to the portion of the membrane 13 between the center C and the fringe 40 and L2 represents the distance from the center C to the fringe 40.

Figure 7C:
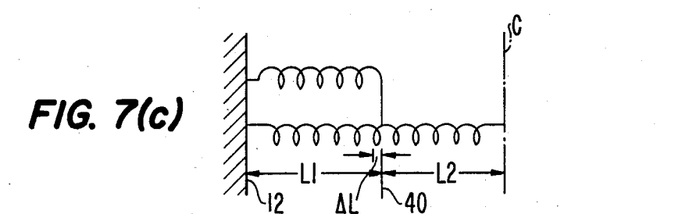

If $\Delta L$ is assumed to be the displacement of the fringe 40 due to stress, then the following mathematical relationships are derived:

$F_a = \alpha T_a$
$F_1 = (E_m T_m + E_a T_a) \Delta L / L \quad 1$
$F_2 = E_m T_m \Delta L / L \quad 2$
$F_a = FHD \ 1 + F_2$ where $F_a$ represents the stress force of the absorbing material 25b; $F_1$ represents the compressive force of the membrane 13 for portion L1; $F_2$ represents the tensile force of the membrane 13 for portion L2; $E_m$ represents Young's modulus of the membrane 13; $E_a$ represents Young's modulus of the absorbing material; $T_m$ represents the thickness of the membrane 13; $T_a$ represents the thickness of the absorbing material; and $\alpha$ represents the stress force per unit cross-sectional area of the absorbing material.

From the above, the following equation can be obtained:

$$[(E_m T_m + E_a T_a)/L1 + E_m T_m/L2]\Delta L = \sigma T_a \quad (1)$$

By substituting actual values of dimensions and material constants, the displacement $\Delta L$ can be obtained. The above equation (1) can be used for the circumstance in which when the absorbing material 25 has complicated patterns, by modifying $\sigma$ to $(\sigma \times D)$, where D represents the pattern density. It has been found that in the situation where the pattern density in the effective pattern region 15 and in the covered region 16 are equal, no deformation occurs.

Described below are several embodiments of the present invention during patterns of various densities which can be formed on the element 13 to prevent deformation. Generally, checkerboard type patterns or similar patterns comprising squares of absorbing material surrounded by void areas of vice-versa work well and are easily formed in the covered region 16 using the conventional steps of mask production.

Figure 8A:
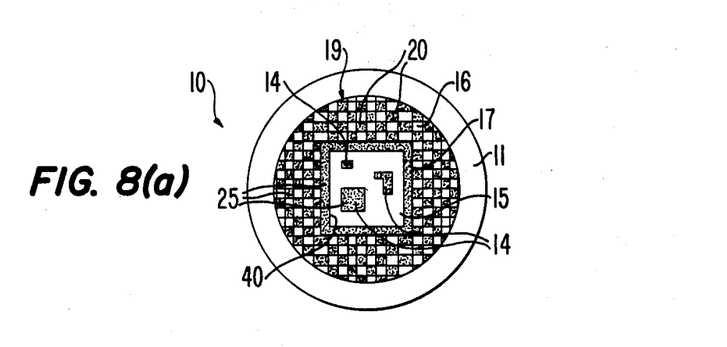
FIG. 8(a) is a plan view of an embodiment of the X-ray mask according to the present invention.
Figure 8B:
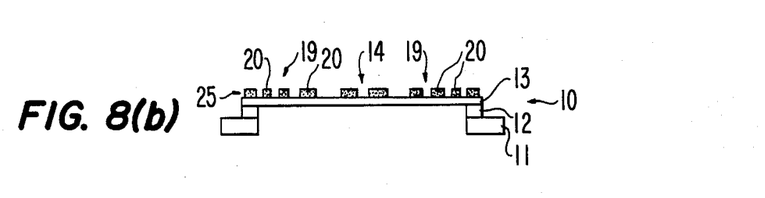
FIG. 8(b) is a cross-sectional, elevational view of the X-ray mask of FIG. 8(a)

FIG. 8(a) is a schematic plan view of one embodiment of the present invention, and FIG. 8(b) is a cross-sectional elevation view thereof. A ring 11 supports a silicon ring 12, on which the membrane 13 is mounted. To simplify the explanation, a single chip pattern consisting of plural patterns 14 is formed in the effective pattern region 15. A band region 17 completely covered by the absorbing material layer 25 is provided immediately surrounding the effective pattern region 15. The band region 17 is necessary to cover or shield the fringe area of the effective pattern region 15 from X-ray beam irradiation during the exposure process. Outside the band region 17 is the covered region 16, in which a checkerboard pattern 19 is formed in the absorbing material layer 25.

The reasons for providing the covered region 16 of substantial extent outside the effective pattern region 15 are as follows:

(1) memberane flatness for the effective region 15 is required within a submicron order, such as 0.2 to 0.3 microns, therefore, the diameter of the membrane 13 should be large enough to afford sufficient excess area to obtain uniform tensile stress in this region; and (2) the silicon ring 12, which supports the membrane 13, does not have an ideal flat surface; therefore, some distance should be provided from the border of the effective pattern region 15 to the silicon ring 12.

Because the uniformly formed absorbing material layer 25 of the prior art mask in the covered region 16 causes displacement at the fringe portion 40 of the effective pattern region 15, the patterns 19 are formed in the covered region 16.

Figure 9:
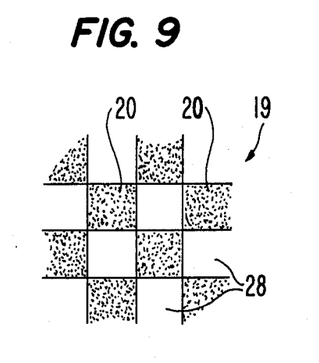
FIGS. 9–11 are illustrations of patterns that may be formed in the covered region of an X-ray mask according to the present invention.
Figure 10:
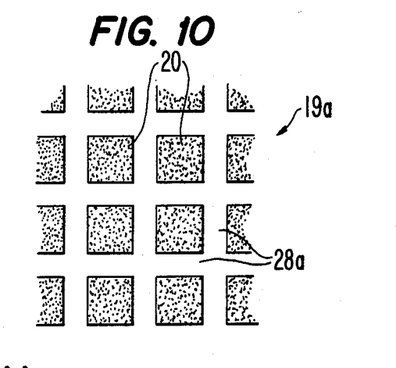
Figure 11:
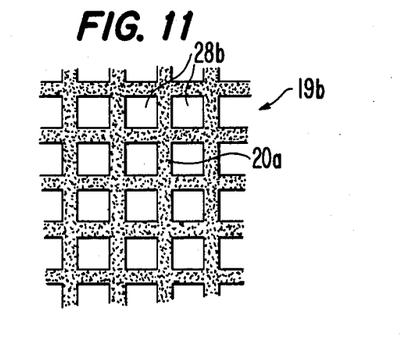

As described above, it is preferred that the pattern density selected for the covered region 16 be substantially the same as that for the effective pattern region 15. Embodiments of practical checkerboard or similar patterns for the covered region 16 are shown in FIGS. 9 through 11. FIG. 9 shows a simple checkerboard pattern having a pattern density of 50%. Each portion 20 of the absorbing material in the checkerboard pattern 19 contacts an adjacent portion 20 at its corners. Adjacent all edges of each portion 20 are blank or void areas 28 in which no absorbing material is deposited. FIG. 10 illustrates a pattern 19a, in which the portions 20 are separated from each other by vertical and horizontal blank or void areas 28a. FIG. 11 illustrates a pattern 19b, in which continuous vertical and horizontal lines 20a of absorbing material in the pattern 19b are formed, isolating void areas 28b.

Figure 12A:
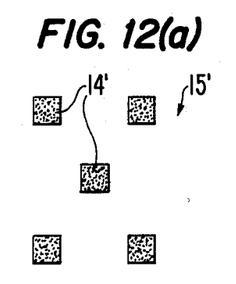
Figure 12B:
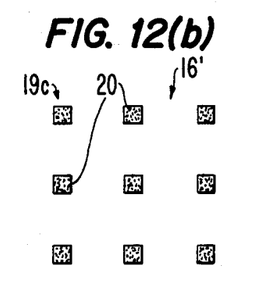
Figure 13A:
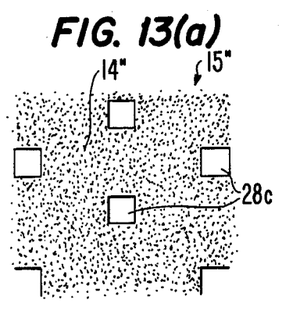
FIGS. 13(a) and 13(b) also show another embodiment of patterns formed in the effective pattern region 15 and the covered region 16 respectively according to the present invention.
Figure 13B:
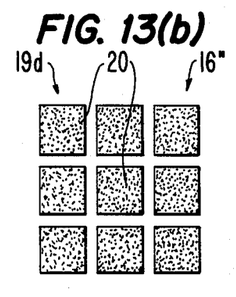

The relationship between the respective pattern densities in the effective pattern region 15 and the covered region 16 are illustrated in FIGS. 12(a) and 12(b), and FIGS. 13(a) and 13(b). FIGS. 12(a) and 13(a) show first and second patterns 14' and 14" in the effective pattern regions 15' and 15" to be reproduced on a semiconductor wafer, and FIGS. 12(b) and 13(b) show the corresponding patterns for the respective covered regions 16' and 16" to suppress deformation of the associated masks according to the present invention.

The pattern 19c in the covered region 16' of FIG. 12(b), has a relatively low pattern density of the X-ray absorbing material (represented by the portions 20), and corresponds to the density found in the effective pattern region 15' of FIG. 12(a), where small portions absorbing material constituting mask patterns 14' are formed. The pattern density of checkerboard-type pattern 19d in the covered region 16" of FIG. 13(b) is high, and corresponds to the density of absorbing material found in the effective pattern region 15" of FIG. 13(a), where blank areas 28c are formed in the absorbing material layer 25. The dotted portions in the figures show the absorbing material formed by gold plating, or by tantalum (Ta) or tungsten (W) etching, or by other ways as explained previously.

It should be understood that in each instance described above that the voids or blank areas permit the passage of X-rays from an X-ray source through the mask for exposing the resist layer of an underlying semiconductor wafer.

Experimentation and calculations using equation (1) have proven that a difference between pattern density ratios for the effective pattern region 15 and covered region 16 of less than about 0.3 is sufficient to prevent mask deformation of greater than 0.1 microns. The above result is obtained by substituting the following quantities into equation (1):

$E_m = 1 \times 10^{12}$ dyne/cm$^2$; $T_m = 4$ microns;
$E_a = 0.8 \times 10^{12}$ dyne/cm$^2$; $T_a = 1$ micron; and
L1, L2 = 1.5 cm.

When assumed that the stress $\sigma$ of $2 \times 10^8$ dyne/cm$^2$ is generated in the absorber, $\Delta L = 0.34$ microns is obtained. This value for deformation occurs when the difference between the pattern density ratios is nearly 1.0 (the difference between the percentages of pattern density for the region is nearly 100%). Therefore, when the difference can be set to approximately 0.3, or about 30%, $\Delta L$ can be reduced to 0.3 times the above value, or approximately to 0.1 microns. A deformation of only 0.1 microns will allow precisely reproduced patterns to be formed on the wafer using the X-ray lithography method.

It is preferable that the dimension of each side of the square blank areas or square sections of the absorbing material is the checkerboard patterns be selected to be less than 1 mm. The desired checkerboard pattern and thus the desired density can then be easily obtained by a CAD system used in the electron beam patterning process for forming the X-ray mask.

The foregoing is considered illustrative only of the principals of the invention. Further, since numerous modifications and changes will readily occur to those skilled in the art, it is not desired to limit the invention to the exact construction and operation shown and described. Accordingly, all suitable modifications and equivalents may be resorted to that fall within the scope of the invention and the appended claims.

What is claimed is:

1. An X-ray exposure mask used for patterning a resist layer of a semiconductor wafer using an X-ray beam, said mask comprising:

a membrane, translucent to the X-ray beam, having a planar surface including a centrally located X-ray mask region on the surface and a non-mask region surrounding said X-ray mask region; and a layer of X-ray absorbing material superposed on said planar surface of said membrane and comprising a first layer portion coextensive with said X-ray mask region and patterned for selectively exposing the X-ray mask region of the membrane surface in a corresponding pattern for selective transmission of an X-ray beam therethrough, and said layer of X-ray absorbing material further comprising a second layer portion coextensive with said non-mask region and patterned for reducing a pattern density of the X-ray absorbing material superposed on the non-mask region and balancing stress in said layer of X-ray absorbing material in the first and second layer portions.

2. An X-ray exposure mask according to claim 1, wherein the respective pattern densities of the X-ray absorbing material of said first and second layer portions differ by no more than 30%.

3. An X-ray exposure mask according to claim 2, wherein the respective pattern densities of the X-ray absorbing material of said first and second layer portions are approximately equal.

4. An X-ray exposure mask according to claim 1, wherein said second layer portion is patterned in a checkerboard pattern.

5. An X-ray exposure mask according to claim 4, wherein said checkerboard pattern of said second layer portion comprises plural, substantially square areas of the X-ray absorbing material, individually separated from each other and in parallel, aligned relationship.

6. An X-ray exposure mask according to claim 4, wherein said checkerboard pattern of said second layer portion comprises plural, substantially square areas through each of which a corresponding portion of the non-mask region is exposed, said areas being individually separated from each other and in an aligned relationship.

7. An X-ray exposure mask for patterning a resist layer of a semiconductor wafer during X-ray lithography, said X-ray exposure mask comprising:
 a ring-shaped base;
 a silicon supporting ring mounted on said base;
 a substantially flat inorganic membrane, translucent to X-rays, formed on said silicon supporting ring and having a substantially planar surface including a centrally located mask region and a non-mask region surrounding said mask region; and
 a layer of X-ray absorbing material superposed on said planar surface of said membrane and comprising a first layer portion coextensive with said mask region and patterned for selectively exposing the mask region of the membrane surface in a corresponding pattern for selective transmission of an X-ray beam therethrough, and said layer of x-ray absorbing material further comprising a second layer portion coextensive with said surrounding non-mask region and patterned for reducing a pattern density of the X-ray absorbing material superposed on the surrounding non-mask region and balancing stress in said layer of X-ray absorbing material between the first and second layer portions.

8. An X-ray exposure mask according to claim 7, wherein said second layer portion includes a solid band of X-ray absorbing material formed on an area of said non-mask region bordering said mask region and a checkerboard pattern over the remaining area of said non-mask region.

9. An X-ray exposure mask according to claim 8, wherein the respective pattern densities of the X-ray absorbing material of said first and second layer portions differ by no more than 30%.

10. An X-ray exposure mask according to claim 9, wherein the respective pattern densities of the X-ray absorbing material of said first and second layer portions are approximately equal.

* * * * *

UNITED STATES PATENT AND TRADEMARK OFFICE
CERTIFICATE OF CORRECTION

PATENT NO. : 4,881,257
DATED : NOVEMBER 14, 1989
INVENTOR(S) : KENJI NAKAGAWA

It is certified that error appears in the above-identified patent and that said Letters Patent is hereby corrected as shown below:

Col. 6, line 43, "$F_a = \alpha T_a$" should be --$F_a = \sigma T_a$--;

line 54, "$\alpha$" should be --$\sigma$--.

Signed and Sealed this

Twenty-ninth Day of May, 1990

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,881,257
DATED : NOVEMBER 14, 1989
INVENTOR(S) : KENJI NAKAGAWA

It is certified that error appears in the above-identified patent and that said Letters Patent is hereby corrected as shown below:

Col. 6, line 43, "$F_a = \alpha T_a$" should be --$F_a = \sigma T_a$--;

line 46, "$F\alpha = FHD\ 1 + F_2$" should be
-- $F_\alpha = F_1 + F_2$ -- line 54, "$\alpha$" should be --$\sigma$--.

This certificate supersedes Certificate of Correction issued May 29, 1990.

Signed and Sealed this

Eighth Day of October, 1991

Attest:

HARRY F. MANBECK, JR.

*Attesting Officer*     *Commissioner of Patents and Trademarks*